United States Patent [19]
Nguyen

[11] Patent Number: 5,519,355
[45] Date of Patent: May 21, 1996

[54] HIGH SPEED BOUNDARY SCAN MULTIPLEXER

[75] Inventor: Hoang Nguyen, Fort Collins, Colo.

[73] Assignees: AT&T Global Information Solutions Company, Dayton, Ohio; Hyundai Electronics America, Milpitas, Calif.; Symbios Logic Inc., Fort Collins, Colo.

[21] Appl. No.: 389,427

[22] Filed: Feb. 14, 1995

Related U.S. Application Data

[63] Continuation of Ser. No. 978,577, Nov. 19, 1992, abandoned.

[51] Int. Cl.⁶ .......................... H03K 17/62; H01L 25/00
[52] U.S. Cl. .......................... 327/565; 327/566; 327/408
[58] Field of Search ............... 307/480–1, 303.1–303.2, 307/572, 243; 327/565, 566, 408

[56] References Cited

U.S. PATENT DOCUMENTS

| | | | |
|---|---|---|---|
| 4,567,385 | 1/1986 | Falater et al. | 307/443 |
| 4,812,678 | 3/1989 | Abe | 307/443 |
| 4,857,773 | 8/1989 | Takata et al. | 307/465 |
| 4,912,339 | 3/1990 | Béchade et al. | 307/243 |
| 4,940,908 | 7/1990 | Tran | 307/243 |
| 4,987,319 | 1/1991 | Kawana | 307/243 |
| 5,012,126 | 4/1991 | Feldbaumer et al. | 307/243 |
| 5,015,883 | 5/1991 | Waller | 307/243 |
| 5,036,215 | 7/1991 | Masleid et al. | 307/243 |

*Primary Examiner*—Margaret Rose Wambach
*Attorney, Agent, or Firm*—Wayne P. Bailey; Douglas S. Foote

[57] ABSTRACT

An input cell for a semiconductor chip having an I/O region proximate the edge of the chip and a core region located inside the I/O region. The input cell is located in the I/O region and includes an input pad for receiving an input signal and a multiplexer. The multiplexer receives an input signal from the pad or a boundary scan signal from the core region and selectively provides one signal or the other to the core region.

19 Claims, 10 Drawing Sheets

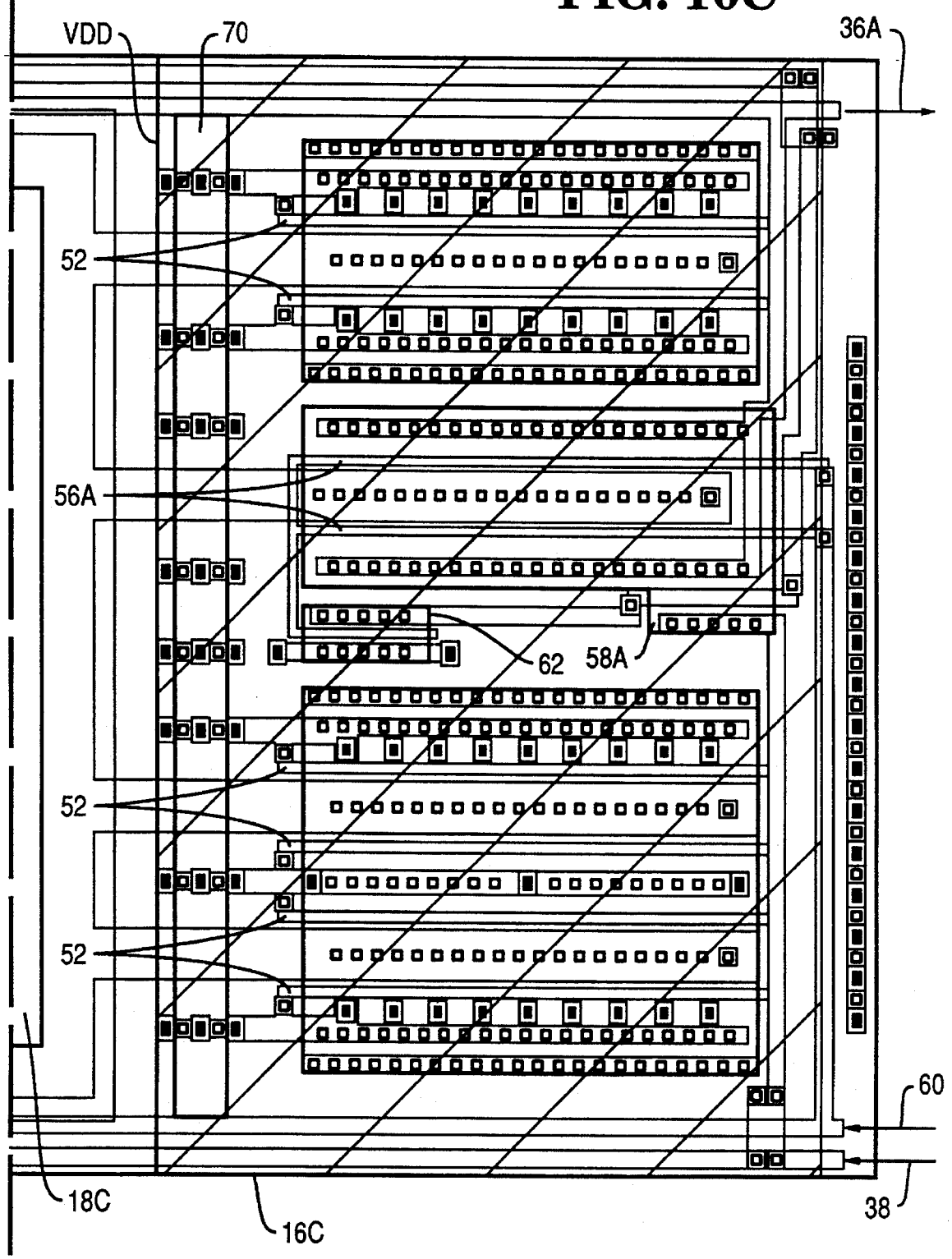

HIGH SPEED BOUNDARY SCAN MULTIPLEXER

This is a continuation of application Ser. No. 07/978,577 filed Nov. 19, 1992, now abandoned.

The present invention relates to semiconductor integrated circuits, and more particularly, to an improved input cell for such circuits. In one embodiment of the present invention, the input cell is used for boundary scan testing of the integrated circuit.

BACKGROUND OF THE INVENTION

The surface area of a semiconductor chip can be roughly divided into two regions: an input/output (I/O) region and a core region. The I/O region includes cells which transfer data signals to and from the chip. These cells may be dedicated to receiving input data signals to the chip, supplying output data signals from the chip or selectively transferring both input and output data signals. The core region includes all other elements on the chip including logic elements, memory, etc. For ease of providing external connections to the I/O cells, the I/O region is typically located proximate the edge of the chip. Each I/O cell is provided with a pad to which a lead wire or pin can be bonded. In addition, the I/O cell can include transistors for driving or boosting the transferred signal and/or transistors for providing electrostatic discharge (ESD) protection and latch-up prevention for the chip.

Data which is input to a semiconductor chip includes both data that is required for normal operation of the chip (hereafter referred to as operational data) and data that is required for testing the chip (hereafter referred to as test data). A test procedure which uses test data is known as boundary scan testing. IEEE Standard 1149.1 describes a boundary scan test procedure for an integrated circuit. In boundary scan testing, a string of buffers are interconnected so as to form a shift register chain around the border of the core region. Data can be entered into these buffers through one or more chip input pins.

The boundary scan test data must be entered into the chip's core logic to test the chip. Basically, the test data must reach the same core logic elements as the operational data. Typically, a multiplexer is used to select operational or test data. In the past, such multiplexers have been included in the core logic with several undesirable results.

First, the multiplexer consumes valuable chip space. For high pin count chips requiring many multiplexers, the required space can be significant. In addition, because the input signal can be fairly strong, the multiplexer must be carefully designed to prevent "latch-up." Such designs require careful attention to the separation of p and n type dopant regions which can require even additional chip space.

Second, many multiplexer designs introduce a propagation delay from the input pad to core logic for the operational data. The propagation delay through the multiplexer may be in the order of 1.025 ns with an integrated circuit cell fabricated using 1 micron CMOS processes. While this delay may not be significant for many conventional low speed circuits, such a delay becomes critical in high speed, e.g., 50 megahertz systems.

Third, the location of the multiplexer should be near to the input cell to reduce propagation delays, capacitive loading, etc. However, it is not always possible to provide an optimal routing of conductive lines for the preferred location of the multiplexer.

Fourth, many conventional multiplexer designs require the data to be buffered after being transferred through the multiplexer in order to have sufficient signal strength to supply several core logic elements. The ability to simultaneously feed multiple elements from a single supply line is known as "fan out." The additional buffering required for large fan out designs introduces further propagation delays for operational data signals.

OBJECTS OF THE INVENTION

It is therefore a first object of the present invention to provide a new and improved input cell for an integrated circuit.

It is a second object of the present invention to provide an input cell for an integrated circuit which reduces time delays associated with adding a multiplexer to implement boundary scan testing.

It is a third object of the present invention to provide an input cell having a multiplexer combined therewith.

It is a fourth object of the present invention to provide an input cell for receiving both input signals and boundary scan signals and having a faster response time for data signals than for boundary scan signals.

It is a fifth object of the present invention to provide an integrated circuit design which provides input pad and multiplexer functions with reduced chip area.

It is a sixth object of the present invention to provide an integrated circuit design which provides input pad and multiplexer functions with reduced susceptibility to latch-up.

It is a seventh object of the present invention to reduce the physical area occupied by an input cell and multiplexer for boundary scan testing of an integrated circuit chip.

It is a eighth object of the present invention to provide an input cell for an integrated circuit which, in addition to receiving input signals, receives a signal from core logic of the integrated circuit and transfers it back thereto.

It is a ninth object of the present invention to provide a new and improved layout for an input cell of an integrated circuit.

It is a tenth object of the present invention to provide an input cell for an integrated circuit which includes a circuit for receiving both a chip input signal and a core logic signal.

It is an eleventh object of the present invention to provide an input cell for an integrated circuit which includes a multiplexer for receiving both a chip input signal and a core logic signal and selectively providing one or the other to the core logic.

It is a twelfth object of the present invention to provide a new and improved method of transferring input signals and boundary scan signals to an integrated circuit.

It is a thirteenth object of the present invention to provide a method for reducing the delay time of a data input signal to an integrated circuit in which the input signal shares a common chip input line with a boundary scan data signal.

SUMMARY OF THE INVENTION

One form of the present invention is an input cell for a semiconductor chip. The chip includes an I/O region proximate the edge of the chip and a core region located inside the I/O region. The input cell is located in the I/O region and includes: an input pad for receiving an input signal, first and second conductive lines which connect the cell to the core region, a first high-speed path which connects the pad to the first line for passing the input signal to the first line, a second low-speed path which connects the second line to the first line for passing a data signal from the core region to the first line, and means connected to each of the paths for selectively connecting the first or second path to the first line.

In another form of the invention, the input cell has a generally rectangular layout and comprises: an input pad, first and second conductive lines connecting the cell to selected logic elements in the chip, and a circuit connected to the pad and first and second lines. In one embodiment, the circuit is a multiplexer.

In yet another form, the invention is a method for reducing the delay time of a data input signal to a semiconductor integrated circuit in which the input signal shares a common chip input line with a boundary scan data signal. The chip is provided with an input cell, and the cell is provided with first and second separate signal paths for the signals to the common chip input line. Either the first or second paths are then selected for the transfer of the respective signal to the input line.

BRIEF DESCRIPTION OF THE DRAWINGS

FIGS. 10A–10C show a layout of the circuit illustrated in FIG. 8 and mapped in FIG. 9.

DESCRIPTION OF A PREFERRED EMBODIMENT

Figure 1:
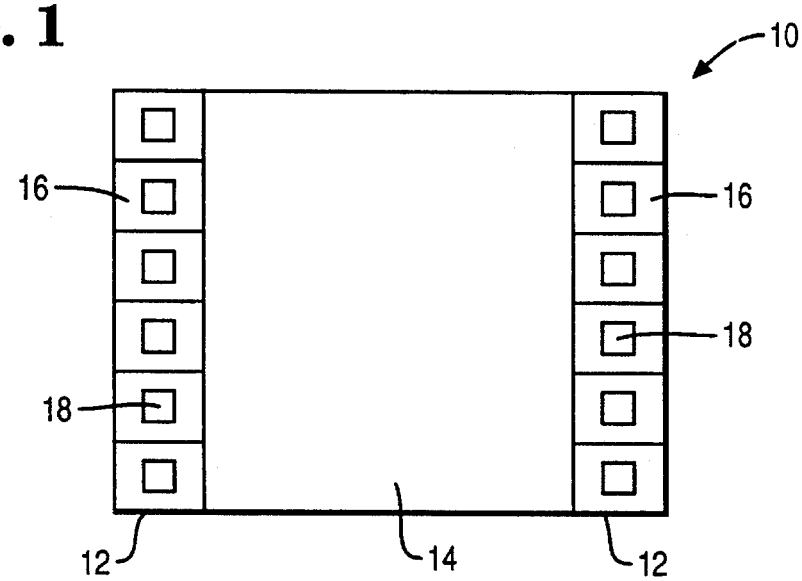
FIG. 1 is a schematic top view of a semiconductor chip depicting I/O and core regions.

FIG. 1 is a schematic top view of a semiconductor chip 10. Chip 10 has I/O region(s) 12 and a core region 14. I/O region 12 is located along opposite edges of chip 10. I/O region 12 includes a number of cells 16 which are dedicated either to receiving data signals from off-chip (in which case they are referred to as "input cells"), to transmitting signals off-chip (in which case they are referred to as "output cells"), or are designed to both receive and transmit data signals (in which case they are referred to as "I/O cells"). Each cell 16 includes a bonding pad 18 for connection to a bonding wire (shown in FIG. 2). Core region 14 is located inside I/O region 12 and contains the various control logic and memory cells which define the functionality of chip 10.

Figure 2:
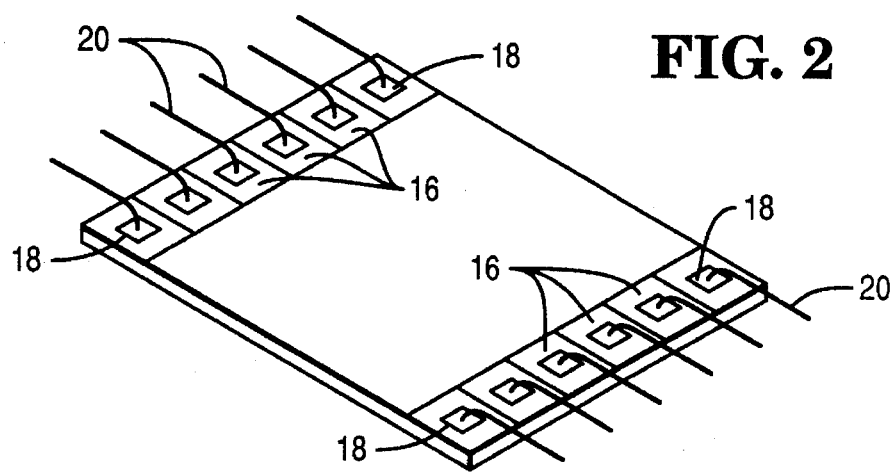
FIG. 2 is a perspective view of the chip in FIG. 1.

FIG. 2 is a simplified perspective view of chip 10 shown in FIG. 1. Each cell 16 has a bonding pad 18 to which a bond wire 20 is affixed.

Figure 3:
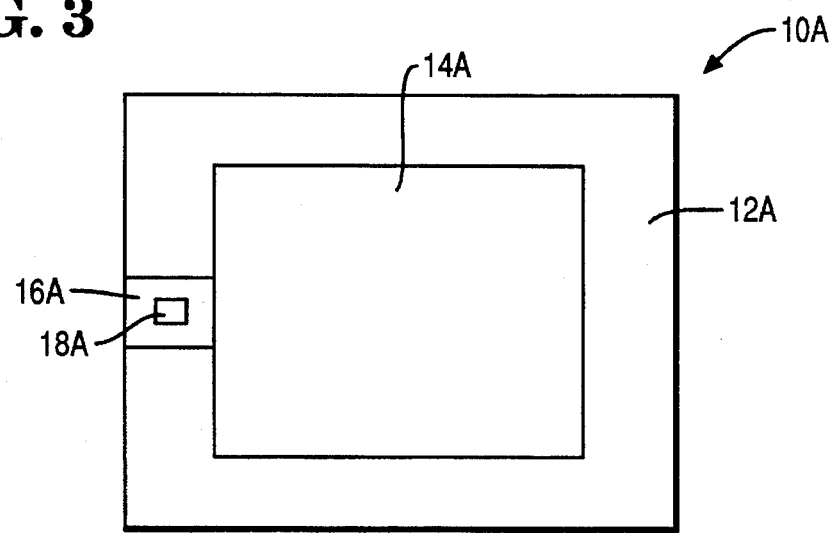
FIG. 3 is a schematic top view of a semiconductor chip depicting an alternative arrangement of I/O and core regions.

FIG. 3 is an alternative form of a semiconductor chip 10a. In this form, the I/O region 12a is located around the entire periphery of chip 10a completely surrounding core region 14a. In both FIGS. 1 and 3, I/O region 12/12a is proximate the edge of the chip. This is generally the most convenient location for the I/O region since each of the cells 16/16a includes a bonding pad 18/18a to which a bond wire is affixed. As will be discussed more fully hereafter, the present invention is an improved input cell located in the I/O region. However, the location of the I/O region is not critical to the operation of the present invention.

Figure 4:
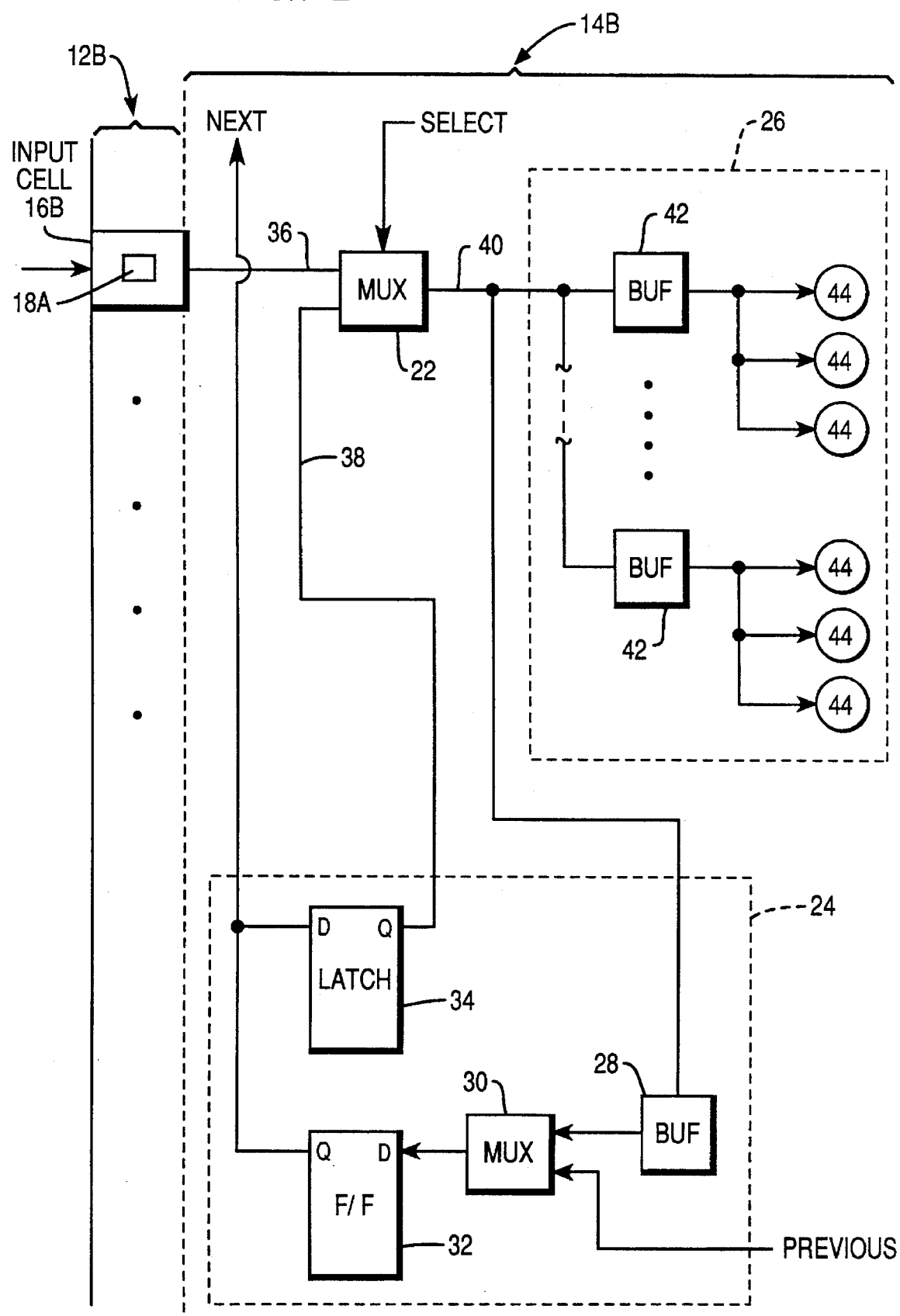
FIG. 4 is a simplified block diagram of a conventional input signal path with boundary scan.

FIG. 4 shows a simplified block diagram of a conventional input signal path for an integrated circuit including a boundary scan test input. An input cell 16b is located in an I/O region 12b. Cell 16b includes a bonding pad 18b and may also include transistors to provide ESD protection. The remaining circuitry shown in FIG. 4 is contained within a portion of core region 14b. This includes a multiplexer 22, a scan path cell 24 and additional core logic 26.

Scan path cell 24 includes a buffer 28, multiplexer 30, D-type flip-flop 32 and latch 34 serially connected, as shown. Scan path cell 24 is typically connected to similar cells to form a scan chain. Data from the preceding scan path cell is entered into cell 24 (on the line labeled "Previous") through multiplexer 30, and data is transferred to the next scan path cell (on the line labeled "Next") from the Q output of flip-flop 32.

In operation, test data can be entered into scan path cell 24 through input cell 16b by providing a "SELECT" signal to multiplexer 22 to select input line 36, and transferring the test data into buffer 28. Test data can then be serially shifted to adjacent scan path cells over the NEXT line. It should be understood that the data for the scan path can be entered through any input cell 16b having the connections shown in FIG. 4. Once data has been stored in scan path cell 24, it will eventually be transmitted to core logic 26 to test the chip. This is accomplished by transferring a data signal from latch 34 through multiplexer 22 by way of line 38. The SELECT signal for multiplexer 22 selects input line 38 and the test data signal is transferred to core logic 26.

Operational data which is input to cell 16b is also transferred to core logic 26 through multiplexer 22.

At the output 40 of multiplexer 22, there is typically connected a plurality of input buffers 42 which allow the signals from multiplexer 22 to be applied to various circuit devices indicated at 44. For normal signal processing, a typical multiplexer 22 adds a delay of approximately 1.025 ns between the time a signal is applied to input cell 16b and the time it reaches the input buffer 42 or fanout terminal line 40.

Figure 5:
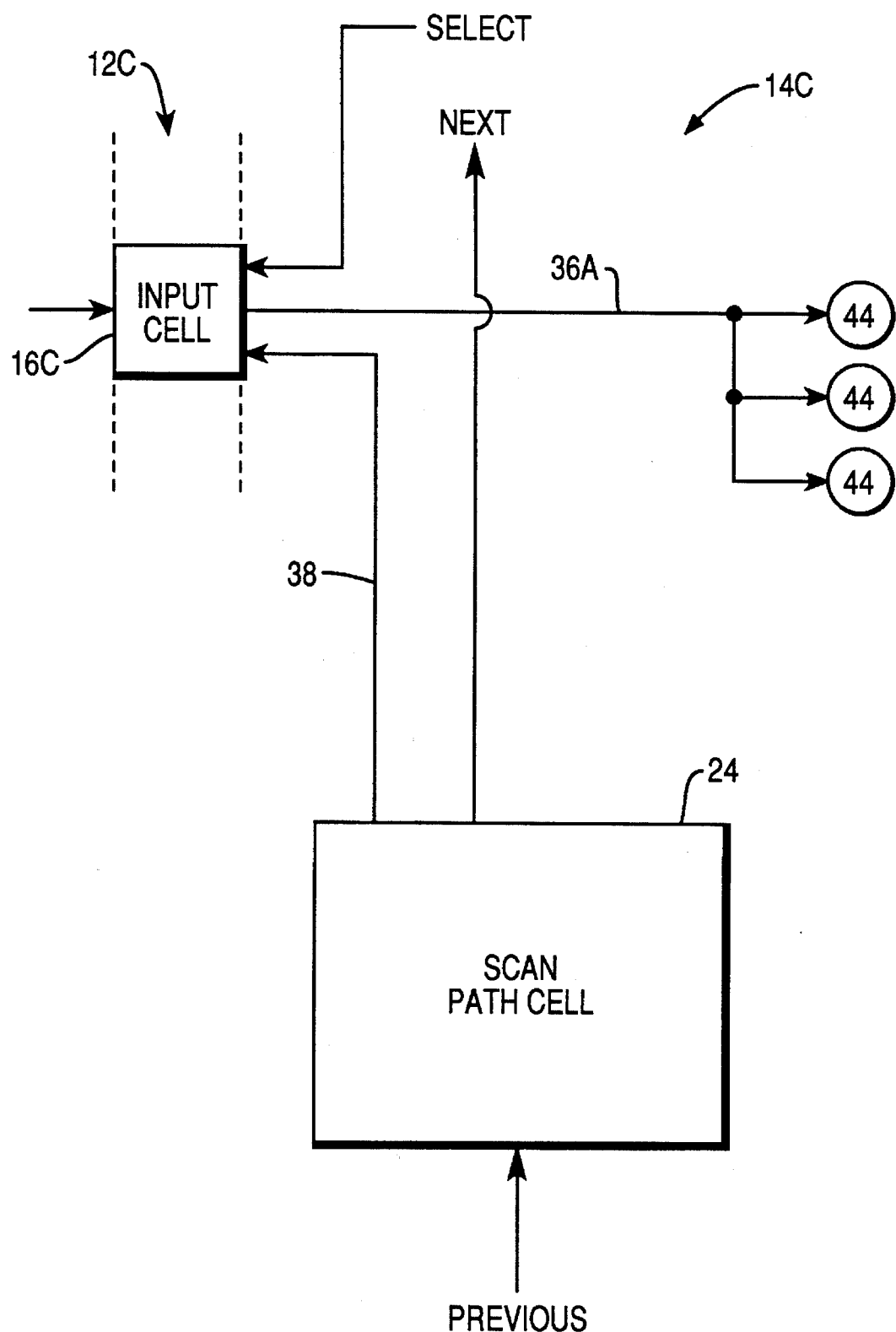
FIG. 5 is a simplified block diagram of an input signal path for implementing boundary scan in accordance with the present invention.

FIG. 5 is a diagram corresponding to FIG. 4 but illustrating an improved system in accordance with the present invention in which a multiplexer is incorporated within an input cell 16c. (The detail design will be described with reference to FIGS. 8 and 10) The delay associated with the multiplexer 22 of FIG. 4 is reduced in the circuit of FIG. 5 to a delay of 0.121 ns or about 12% of the delay associated with the circuit of FIG. 4.

Figure 6:
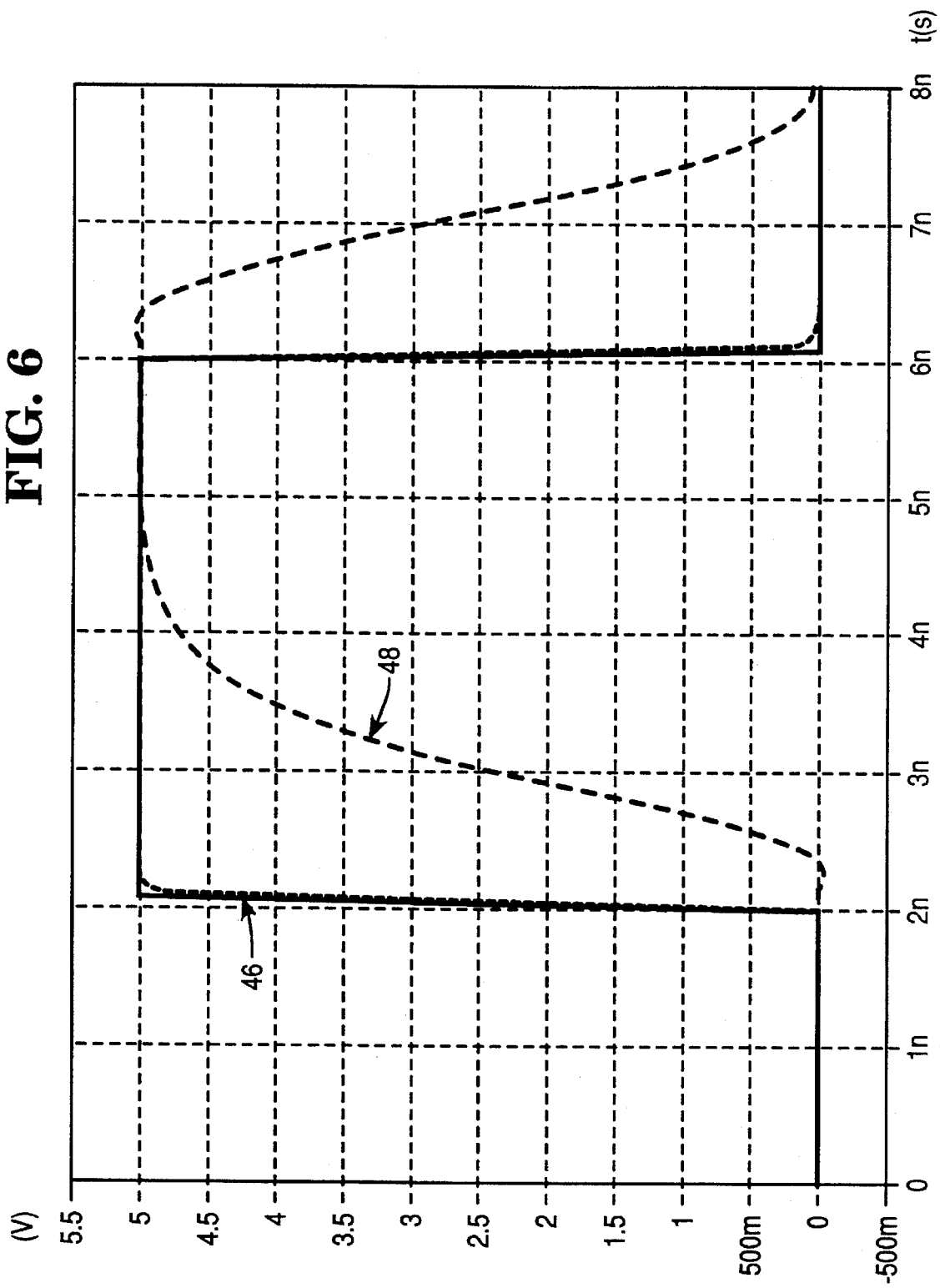
FIGS. 6 and 7 are timing graphs comparing the operation of the signal paths of FIGS. 4 and 5, respectively.
Figure 7:
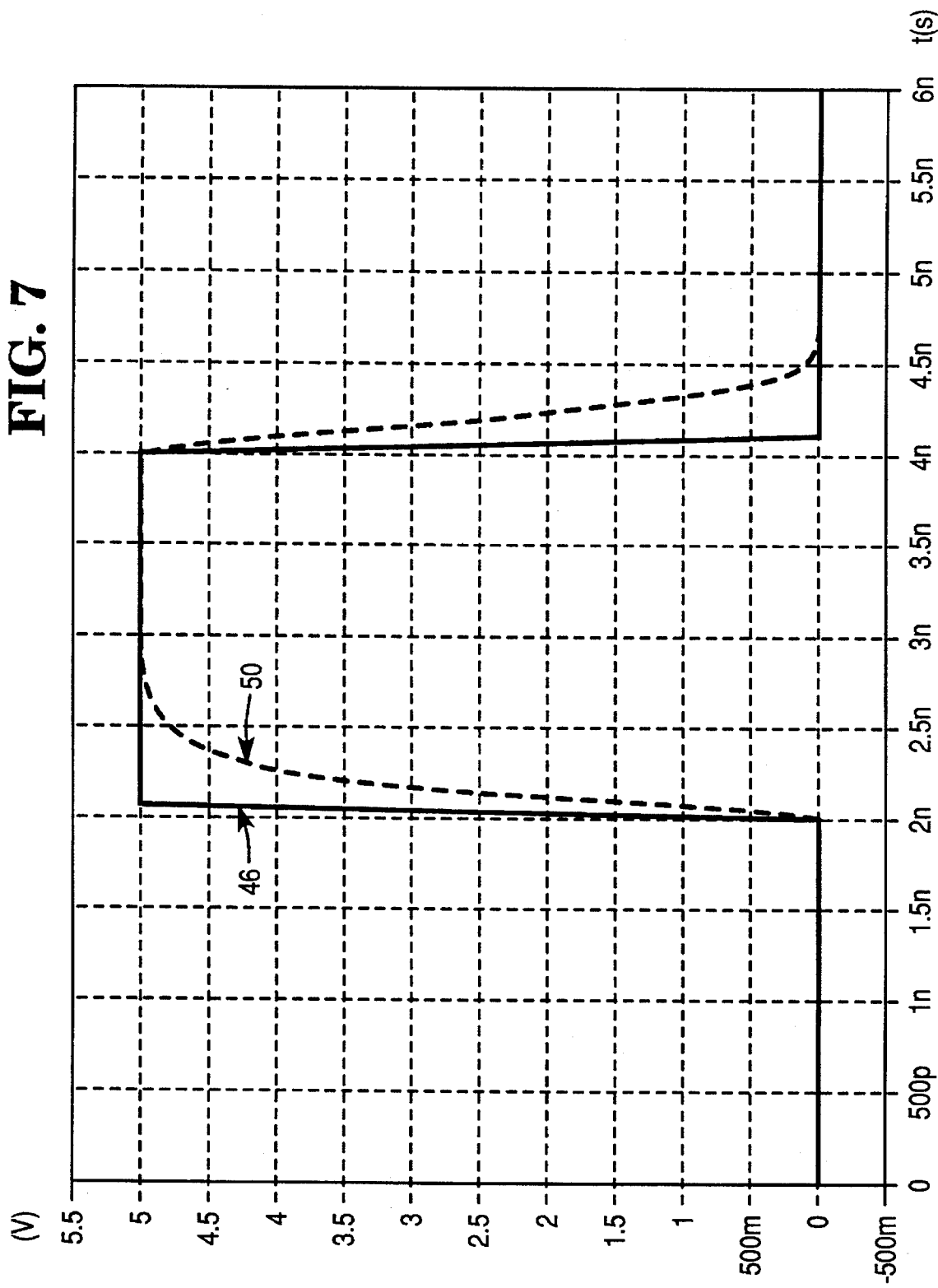

Turning briefly to FIGS. 6 and 7, there are shown graphs of the propagation delay through the circuits of FIG. 4 and FIG. 5 respectively. Note that in FIG. 6, the input signal indicated at 46 reaches a threshold value of 2.5 volts at 2.05 ns while the signal 48 at fanout line 40 reaches the same value at about 3.05 ns, a delay of approximately 1 ns. During the high to low transition, the input signal 46 reaches its midpoint value at just above 6 ns while the signal 48 at fanout 40 doesn't reach its midpoint value until a point greater than 7 ns. The actual measured delays were about 0.995 ns in the low to high transition and about 1.053 ns in the high to low transition.

Referring to FIG. 7, the time delay between the input signal 46 and the output signal 50 from the inventive input cell measured about 0.095 ns in the low to high transition and about 0.146 ns in a high to low transition. The average delay in the inventive cell is only about 0.121 ns. Thus, the inventive cell shows an improvement of 88% between the propagation delay in a conventional circuit and the propagation delay in the inventive cell.

Figure 8:
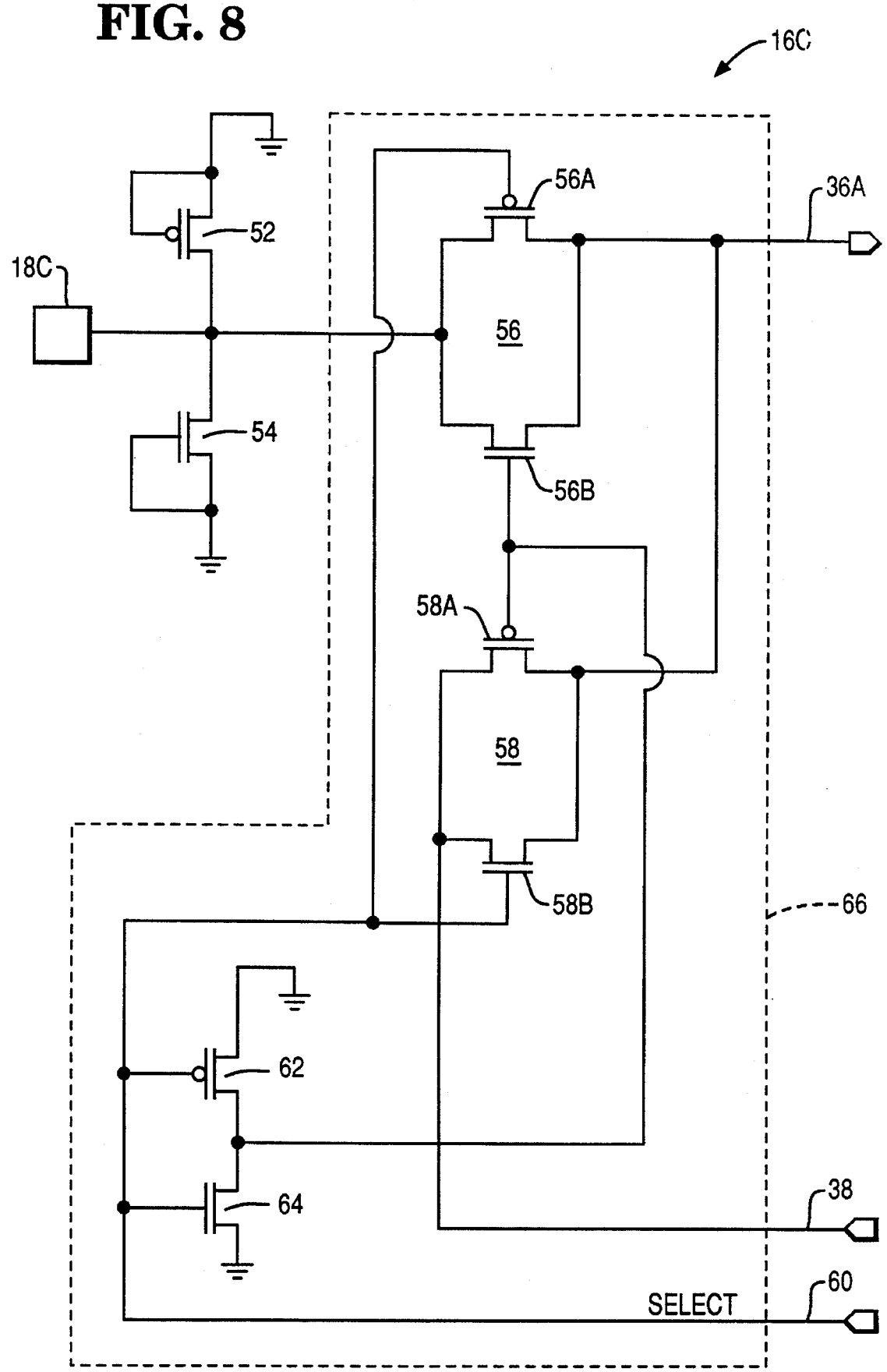
FIG. 8 is a circuit diagram of the input cell illustrated in FIG. 5.

Turning now to FIG. 8, there is shown one implementation of the input cell 16c in accordance with the present invention. Input cell 16c is located in an I/O region of a semiconductor chip and includes an input pad 18c which receives input data signals to the chip. Cell 16c is connected to the core region of the chip through conductive lines 36a, 38 and 60. Line 36a provides an output signal from cell 16c to the core region, line 38 provides a boundary scan test signal from the core region and line 60 provides the SELECT control signal from the core region.

Input pad 18c is connected to a pair of electrostatic protection circuits 52 and 54 illustrated by a diode connected PMOS transistor and a diode connected NMOS transistor, respectively. The input pad 18c is also connected to a drain terminal of a field effect transistor switch 56 comprising a pair of field effect transistors (FETs) 56A, 56B with their drain terminals and their source terminals each connected one to the other. A first one of the transistor pair forming switch 56 is constructed such that it becomes conductive when a signal of a first polarity is applied to its control electrode (gate terminal). The other of the transistor pair 56 is so constructed that a signal of a second polarity applied to its control electrode will force it to become conductive. In effect, transistor switch 56 is a high-speed transfer gate between input pad 18c and output line 36a.

A second switch 58 is constructed in the same manner as the switch 56 with a pair of FETs 58A, 58B and has a terminal connected to receive the boundary scan data signals from conductive input line 38. One of the transistors making up switch 58, which is turned on by a signal of a second polarity, is connected to the control electrode of the other of the transistors in switch 56 which is turned off by the signal of the second polarity. Similarly, the control electrode of the other of the transistors in switch 58 which is turned off by a signal of the first polarity is connected to the control electrode of the one of the transistors in switch 56 which is turned on by the signal of the first polarity. In effect, transistor switch 58 is a transfer gate between input line 38 and output line 36a. Transfer switch 58 operates at a somewhat slower speed than switch 56, as will be described more fully hereafter.

The control electrode of transistor 58B is connected directly to the conductive line 60 providing the "SELECT" signal which controls the switches 56 and 58 to determine whether the input data or the boundary scan signals are connected to the output terminal 36a. The select logic input line 60 is connected to an inverter comprising a pair of transistors 62 and 64. The inverted signal from select line 60 is connected to the other of the control electrodes of the switches 56 and 58. Viewed collectively, switches 56 and 58 and the inverter comprising transistors 62 and 64 form a two-input multiplexer 66.

For purposes of illustration, if a high or logical one signal is applied to select logic input line 60, this signal is coupled directly to the control electrode of transistor 56A forcing that transistor into a non-conductive state. The inverted signal is a logic zero signal coming from the output of the inverter transistors 62 and 64 and is coupled to a control electrode of transistor 56B and forces that transistor into a non-conductive state. At the same time, the logic one signal applied to the control electrode of transistor 58B causes that transistor to be conductive and the logic zero signal applied to the control electrode of transistor 58A causes that transistor to become conductive. Accordingly, a logic one signal applied to select logic input line 60 allows the boundary scan signals at line 38 to be passed through switch 58 to line 36a. If the select logic gate signal is changed to a logic zero signal, the switch 58 is forced into a non-conductive state and the switch 56 will be conductive. This will allow the operational data signals received by input pad 18c to be passed through to line 36a.

In order to increase the speed with which data is passed from pad 18c to line 36a, the switch 56 is formed in a larger size with a larger conduction area than the switch 58. In particular, the circuit illustrated in FIG. 8 is implemented in one micron CMOS technology and utilizes a 124.8 micron size layer for switch 56 and a 16.8 micron layer for switch 58. Since the conduction area of switch 56 is much larger than the conduction area of switch 58, switch 56 is able to operate at a much higher speed than switch 58. Based on the given dimensions, the switch 56 is approximately 7 and ½ times the conduction area of switch 58. Since the speed at which a signal can be propagated through the transistor switch is a function of conduction area, it will be appreciated that the switch 56 is significantly faster than the switch 58. However, as previously mentioned, while it is critical to provide high speed paths for data in the integrated circuit, it is not critical during testing to provide a relatively high speed path for logic signals being applied to set certain logic circuits within the integrated circuit for boundary scan evaluation.

The present invention incorporates the multiplexer 66 into the silicon area of the input pad thus eliminating the line impedance and the input buffers. This design also saves silicon area on the circuit chip by freeing the area previously occupied by multiplexer 22 (FIG. 4). Furthermore, advantage has been taken of the slow speed requirements of boundary scan testing to allocate silicon area so as to enlarge the area and concurrently increase the speed of the transistors associated with data signal processing through multiplexer 66.

Figure 9:
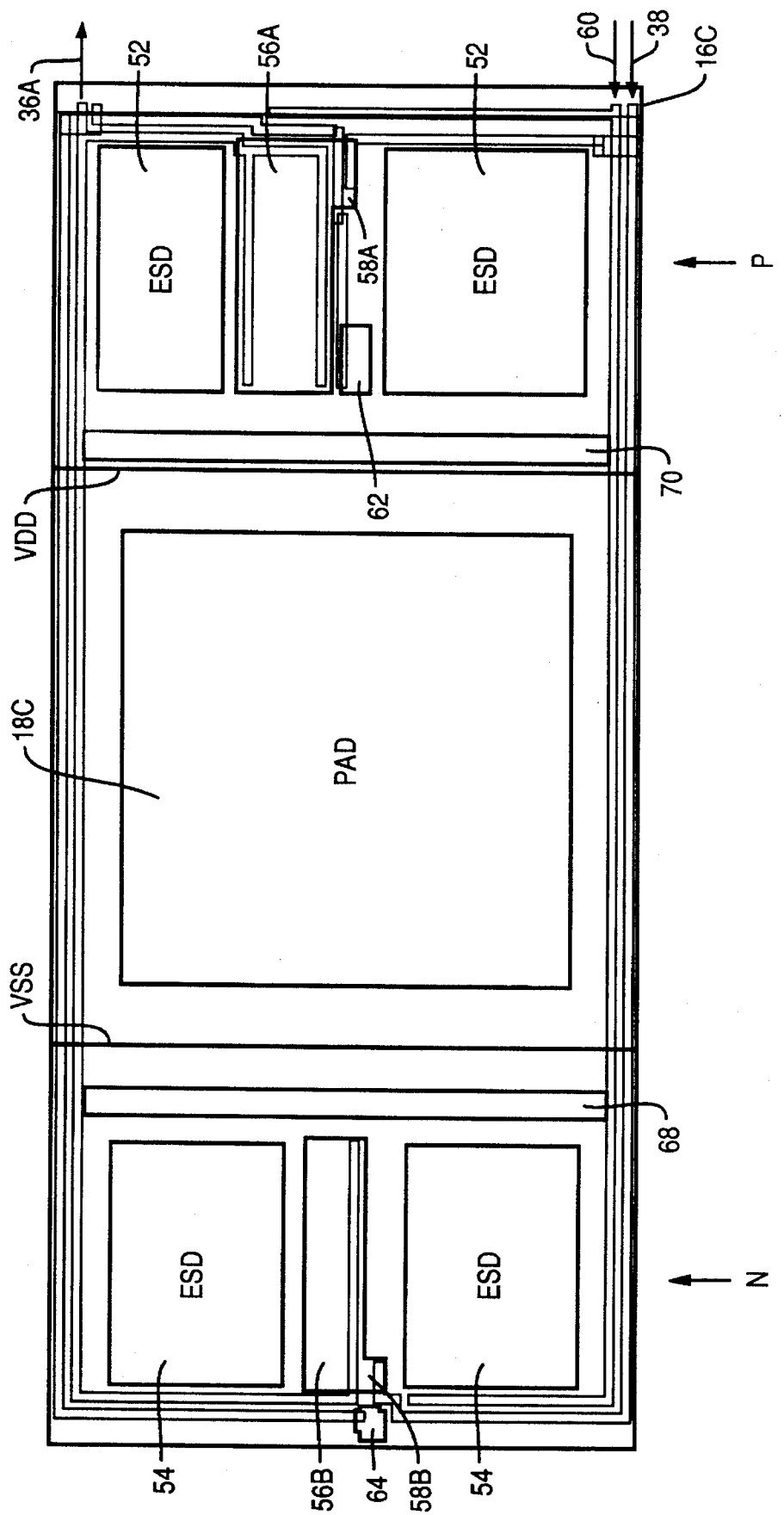
FIG. 9 is a map of the layout for the circuit illustrated in FIG. 8.

FIG. 9 is a map of the layout for input cell 16c shown in FIG. 8. As shown, the layout of cell 16c is generally rectangular in order to allow efficient placement of multiple cells in an I/O region. Input pad 18c is positioned in the center of cell 16c in order to separate the NMOS and PMOS transistors in the cell. ESD protection transistors 54 and 52 are located at the corners of cell 16c and by far consume the most chip space of any of the active elements. Isolation regions 68 and 70 separate pad 18c from the active elements. The purpose of the isolation regions is to separate p and n regions on the chip. If p and n regions are too close, a current flow will sometimes flow between the p and n regions. This condition is known as "latch-up" and can only be corrected by removing power from the chip.

The remaining transistors making up multiplexer 66 for input cell 16c are nested between the ESD transistors. NMOS transistors 56B, 58B and 64 are positioned between portions of ESD transistor 54. Similarly, PMOS transistors 56A, 58A and 62 are positioned between portions of ESD transistor 52. In order to minimize the propagation delay time through input cell 16c for input signals received on pad 18c, transistors 56A and 56B are relatively large, as discussed previously. Input lines 38 and 60 and output line 36a are connected to the core region and the various transistors, as shown.

Figures 10, 10A:
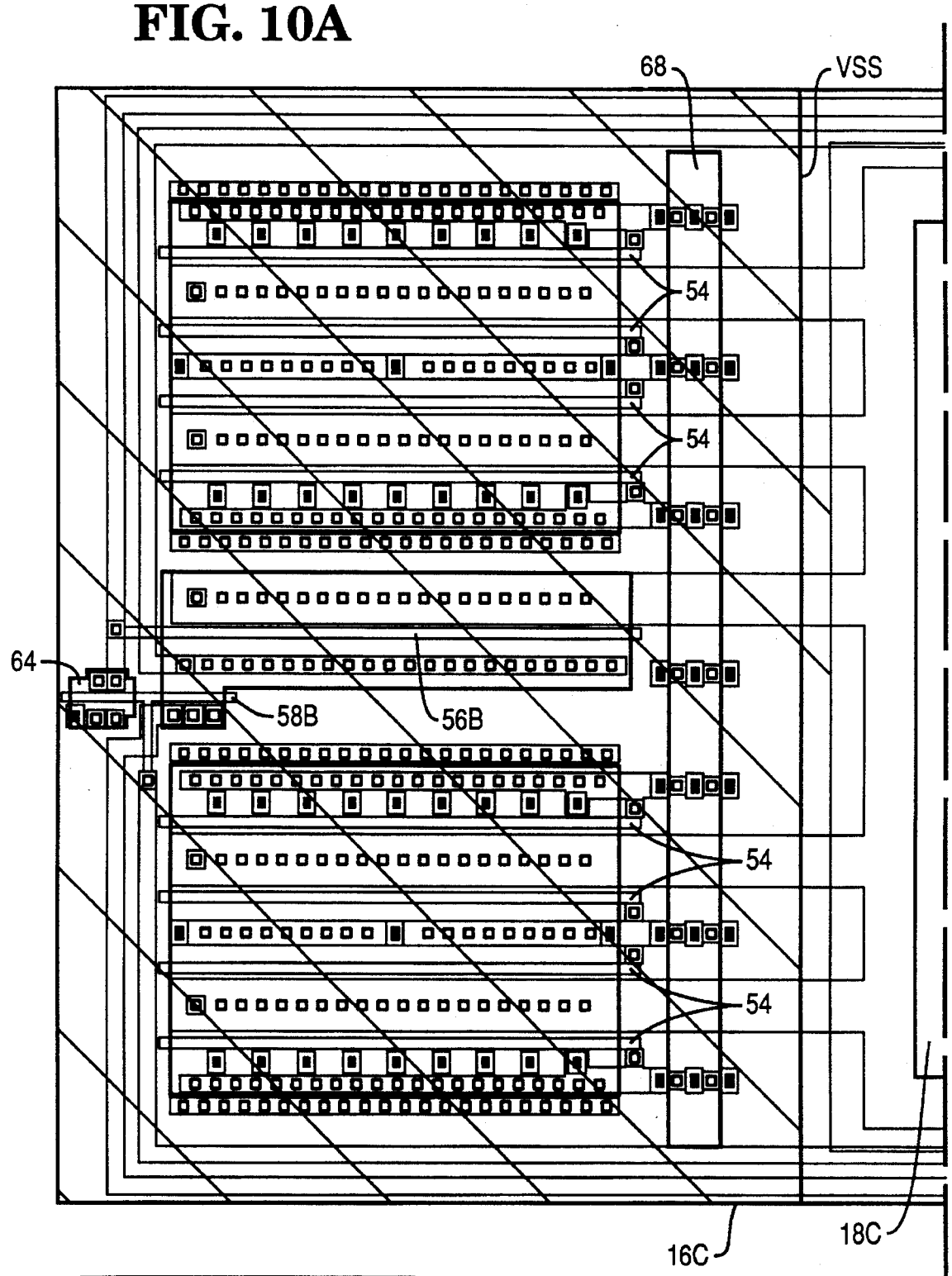
Figure 10B:
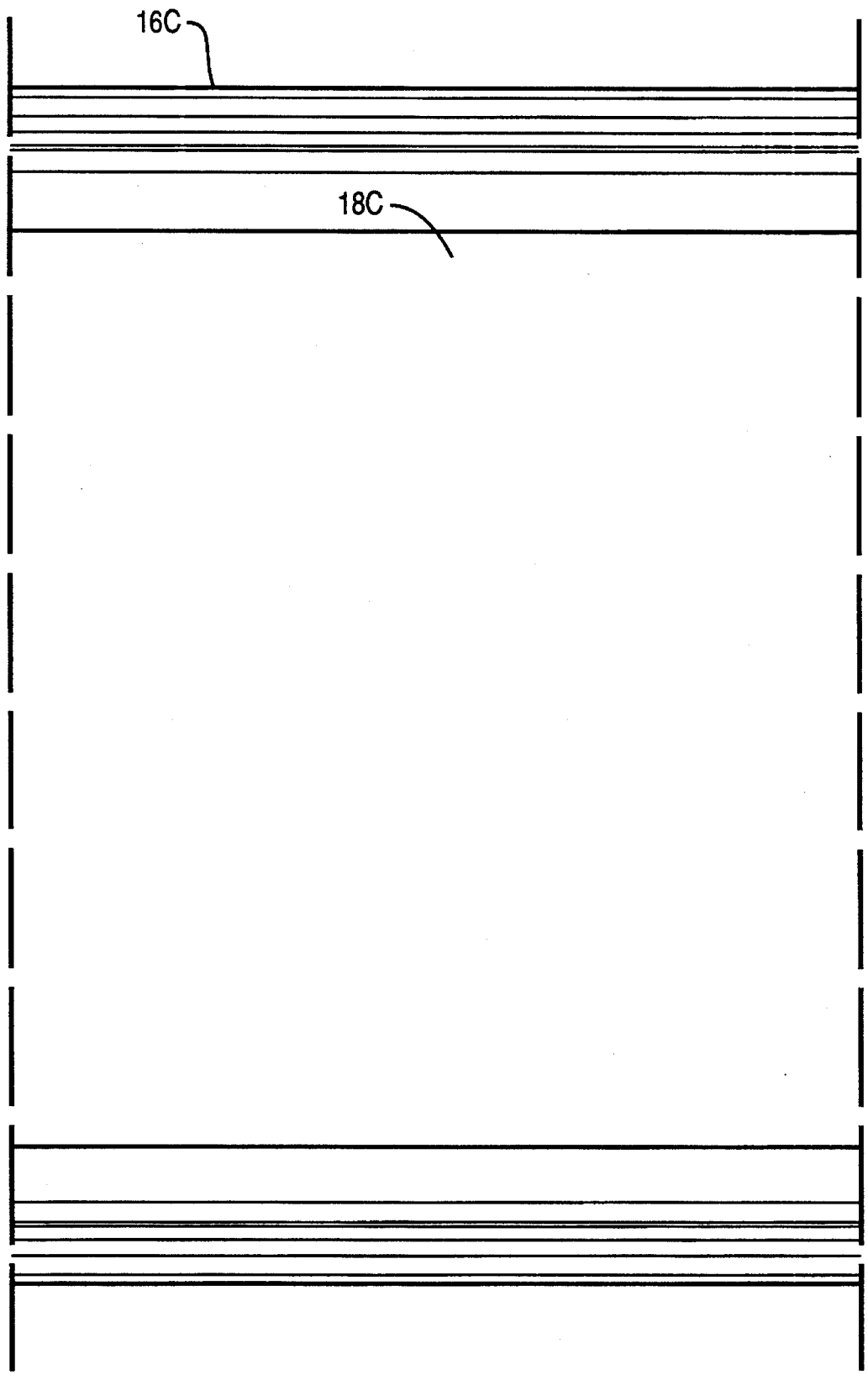

FIGS. 10A–10C show a layout of the circuit illustrated in FIG. 8 and mapped in FIG. 9. Each of transistors 54, 56B, 58B, 64, 52, 56A, 58A and 62 are labeled be a lead line connected to their respective control electrode.

One of the unique aspects of the present invention is the integration of new functionality into a cell which is otherwise dedicated to I/O functions. Previously, such cells have been known to incorporate ESD and signal driving capability. However, the present invention takes a multiplexing capability previously only available in core logic and integrates it into an input cell. Viewed another way, the present invention incorporates into an input cell a circuit which processes signals other than the input signal. This other signal or signals are received from the core logic region, processed and a signal returned to the core region.

It will be clear to those skilled in the art that the present invention is not limited to the specific embodiment disclosed and illustrated herein. Numerous modifications, variations, and full and partial equivalents can be undertaken without departing from the invention as limited only by the spirit and scope of the appended claims.

What is desired to be secured by Letters Patent is as follows.

What is claimed is:

1. A semiconductor chip comprising:
   an I/O region proximate an edge of the chip;
   a core region located inside said I/O region; and
   an input cell located in said I/O region, comprising an input pad for receiving an input signal;
   a first conductive line coupling said input cell to a first portion of said core region;
   a second conductive line coupling said input cell to a second portion of said core region;
   a high-speed path connecting said input pad to said first line for passing said input signal to said first line;
   a low-speed path connecting said second line to said first line for passing a data signal from said core region to said first line; and
   means connected to each of said paths for selectively connecting said first or second path to said first line.

2. The input cell of claim 1 wherein said first and second paths each includes a transfer gate switchable between conductive and non-conductive states.

3. The input cell of claim 2 wherein each of said gates includes at least one field effect transistor (FET) having a control electrode connected to said means.

4. The input cell of claim 3 wherein the FET in said first path has a conduction area greater than the conduction area of the FET in said second path.

5. The input cell of claim 4 further comprising:
   a third conductive line connecting said input cell to said core region;
   wherein said means connects said third line to the control electrode of said FETs.

6. The input cell of claim 5 wherein said first path includes first and second FETs, the first FET being responsive to a signal of a first polarity for conducting current between its source and drain terminals and the second FET being responsive to a signal of a second polarity for conducting current between its source and drain terminals.

7. The input cell of claim 6 wherein said second path includes third and fourth FETs, the third FET being responsive to a signal of a first polarity for conducting current between its source and drain terminals and the fourth FET being responsive to a signal of a second polarity for conducting current between its source and drain terminals.

8. The input cell of claim 7 wherein the control electrode of the first FET is connected to the control electrode of the third FET and the control electrode of the second FET is connected to the control electrode of the fourth FET.

9. The input cell of claim 8, wherein said means includes:
   an inverter connected between the third line and the control electrodes of the first and third FETs;
   wherein said third line is connected directly to the control electrodes of the second and fourth FETs.

10. A semiconductor chip comprising:
    an I/O region proximate an edge of the chip;
    a core region located inside said I/O region; and
    an input cell located in said I/O region including:
      an input pad for receiving an input signal;
      a first conductive line coupling said input cell to a first portion of said core region;
      a second conductive line coupling said input cell to a second portion of said core region; and
      a multiplexer having inputs connected to said input pad and second conductive line and having an output connected to said first conductive line.

11. In a semiconductor chip with an I/O region and a core region, an input cell within said I/O region, comprising:
    an input pad;
    a first conductive line coupling said input cell to a first portion of said core region;
    a second conductive line coupling said input cell to a second portion of said core region; and
    a multiplexer having inputs connected to said input pad and to said first line and an output connected to said second line.

12. The input cell of claim 11 further comprising:
    ESD transistors connected to said pad.

13. In a semiconductor chip with an I/O region and a core region, an input cell within said I/O region, said cell having a generally rectangular layout and comprising:
    an input pad;
    ESD transistors connected to said input pad;
    first and second conductive lines connected to said core region;
    a multiplexer having inputs connected to said input pad and to said first line and an output connected to said second line, wherein:
    said multiplexer includes a first transistor connected between said pad and said second line and a second transistor connected between said first line and said second line; and
    said first and second transistors are positioned between two of said ESD transistors.

14. The input cell of claim 13, wherein said first transistor has a conduction area greater than the conduction area of said second transistor.

15. The input cell of claim 14 wherein said input pad is positioned in the center of said rectangular layout.

16. The input cell of claim 15 wherein said ESD transistors are positioned on opposite sides of said pad.

17. In a semiconductor chip including logic elements in a core region and an input cell in an I/O region, comprising:
an input pad;
a first conductive line coupling said input cell to a first portion of said core region;
a second conductive line coupling said input cell to a second portion of said core region; and
a circuit connected to said input pad and first and second conductive lines.

18. The input cell of claim 17 wherein said circuit is a multiplexer having first and second inputs connected to said input pad and first line, respectively, and having an output connected to said second line.

19. The input cell of claim 18 further comprising:
a third conductive line connecting said circuit to selected ones of said logic elements;
wherein said multiplexer has a third input for controlling whether said input pad or said first line is connected to said second line; and
wherein said third input is connected to said third conductive line.

* * * * *